US006483225B1

(12) United States Patent
Spigelmyer

(10) Patent No.: US 6,483,225 B1
(45) Date of Patent: Nov. 19, 2002

(54) ULTRASOUND TRANSDUCER AND METHOD OF MANUFACTURE THEREOF

(75) Inventor: Matthew T. Spigelmyer, Penna Furnace, PA (US)

(73) Assignee: Acuson Corporation, Mountain View, CA (US)

( * ) Notice: Subject to any disclaimer, the term of this patent is extended or adjusted under 35 U.S.C. 154(b) by 120 days.

(21) Appl. No.: 09/610,191

(22) Filed: Jul. 5, 2000

(51) Int. Cl.[7] ........................ H01L 41/083; H01L 41/22

(52) U.S. Cl. ................... 310/313 R; 156/154; 156/268; 310/335; 310/348; 367/180; 367/150

(58) Field of Search ................................ 73/1.79, 1.82, 73/587, 603; 156/154, 196, 250, 278, 280, 268; 310/335, 311, 313 A, 313 D, 313 R, 322, 340, 345, 348; 367/103, 119, 180, 150

(56) References Cited

U.S. PATENT DOCUMENTS 4,281,550 A * 8/1981 Erikson ...................... 310/334
4,699,150 A * 10/1987 Kawabuchi et al. ........ 600/446
5,438,998 A 8/1995 Hanafy
5,764,596 A 6/1998 Hanafy et al.
5,844,349 A * 12/1998 Oakley et al. .............. 310/340
5,945,770 A 8/1999 Hanafy
5,976,091 A 11/1999 Hanafy
6,043,589 A 3/2000 Hanafy
6,049,159 A * 4/2000 Barthe et al. ............... 310/326

OTHER PUBLICATIONS

Desilets, "Current Array Architectures—The Marriage of Acoustic Design with Processing and Manufacturing Techniques," Ultrasonic Transducer Workshop Program, Aug. 17, 1994 (24 pages).

* cited by examiner

*Primary Examiner*—Richard Crispino
*Assistant Examiner*—Sing P Chan

(57) ABSTRACT

The preferred embodiments described herein provide an improved ultrasound transducer and method of manufacture thereof. In one preferred embodiment, a method of manufacturing an ultrasound transducer is provided comprising the acts of supporting a layer of piezoelectric material with a window and separating the layer of piezoelectric material into at least two elements by dicing through the layer of piezoelectric material and at least partially into the window. In another preferred embodiment, an ultrasound transducer is provided comprising a first transducer element, a second transducer element, and a window coupled with the first and second transducer elements and comprising a kerf positioned between the first and second transducer elements.

33 Claims, 4 Drawing Sheets

ULTRASOUND TRANSDUCER AND METHOD OF MANUFACTURE THEREOF

BACKGROUND

Ultrasonic phased-array transducers comprise a number of transducer elements arranged along an azimuth axis that are used to transmit and receive ultrasonic energy. Typically, individual transducer elements are formed by dicing a monolithic piece of piezoelectric material. In one manufacturing approach, one side of a matching layer is bonded to a monolithic piece of piezoelectric material, and another side of the matching layer is temporally bonded onto a platen, which provides support to the assembly during the dicing operation. In this approach, a dicing saw cuts through the piezoelectric material, through the matching layers, and into the platen. Then, the kerfs formed by the dicing operation are filled, electrical connections are made to the individual elements, and a backing is cast onto the diced piezoelectric material. The platen is then removed from the matching layers, and an acoustic window (typically, a soft RTV rubber or urethane lens) is applied over the matching layers. One disadvantage to this approach is the difficulty and labor associated with removing the platen.

In another manufacturing approach, a flex circuit is disposed on the piezoelectric material to provide positive electrical connection to each transducer element, and the piezoelectric material is bonded to a solid backer with the flex circuit sandwiched between the piezoelectric material and the backer. The matching layers are then bonded to the piezoelectric material with a sandwiched foil layer used as a ground connection. A dicing saw cuts from the patient side of the assembly through the matching layers, through the piezoelectric material, and into the solid backer. In this way, the undiced portion of the solid backer holds the diced assembly together. After the dicing operation, an acoustic window is applied over the matching layers. Because the solid backer supports the assembly during the dicing operation and is part of the final transducer device, the solid backer does not need to be removed, unlike the platen in the approach described above.

In yet another approach, two matching layers are cast onto the piezoelectric material and ground to a desired thickness. Either the piezoelectric material only or the piezoelectric material and one (but not both) of the matching layers is diced from the backing side. Then, an acoustic window is applied over the matching layers, positive and negative electrical connections are made on the backing side of the ceramic, and a backer is cast in place. Because both matching layers are not diced in this approach, the resulting transducer may not have an optimal off-axis response since the individual elements are not completely isolated.

There is a need, therefore, for an ultrasound transducer and method of manufacture thereof that overcome the disadvantages described above.

SUMMARY

The present invention is defined by the following claims, and nothing in this section should be taken as a limitation on those claims.

By way of introduction, the preferred embodiments described below provide an improved ultrasound transducer and method of manufacture thereof. In one preferred embodiment, a method of manufacturing an ultrasound transducer is provided comprising the acts of supporting a layer of piezoelectric material with a window and separating the layer of piezoelectric material into at least two elements by dicing through the layer of piezoelectric material and at least partially into the window. In another preferred embodiment, an ultrasound transducer is provided comprising a first transducer element, a second transducer element, and a window coupled with the first and second transducer elements and comprising a kerf positioned between the first and second transducer elements.

The preferred embodiments will now be described with reference to the attached drawings.

DETAILED DESCRIPTION OF THE PRESENTLY PREFERRED EMBODIMENTS

Figure 1:
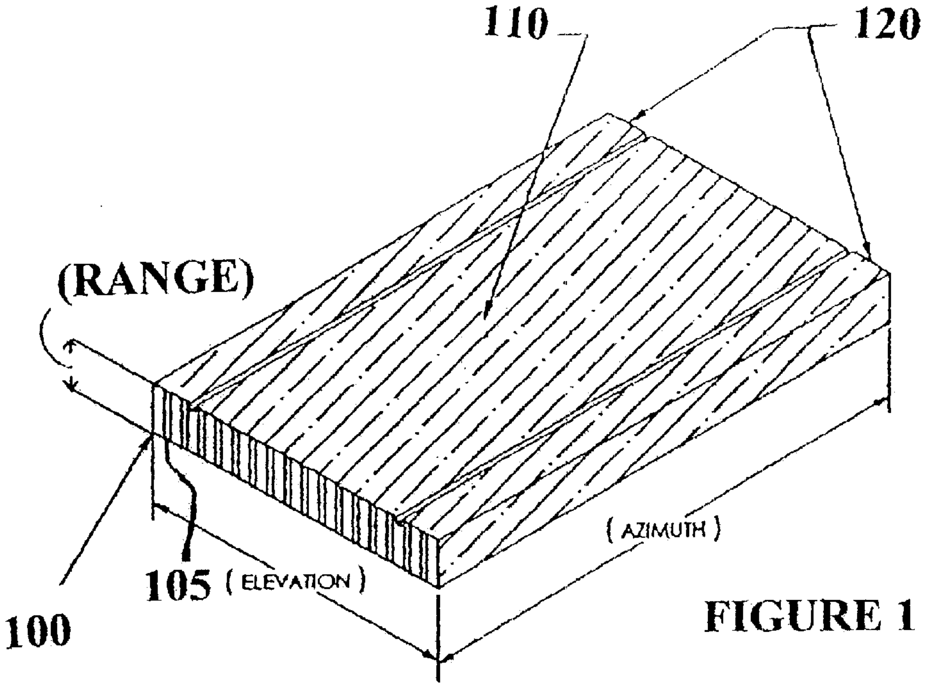
FIG. 1 is an illustration of a layer of piezoelectric material of a preferred embodiment.
Figure 5:
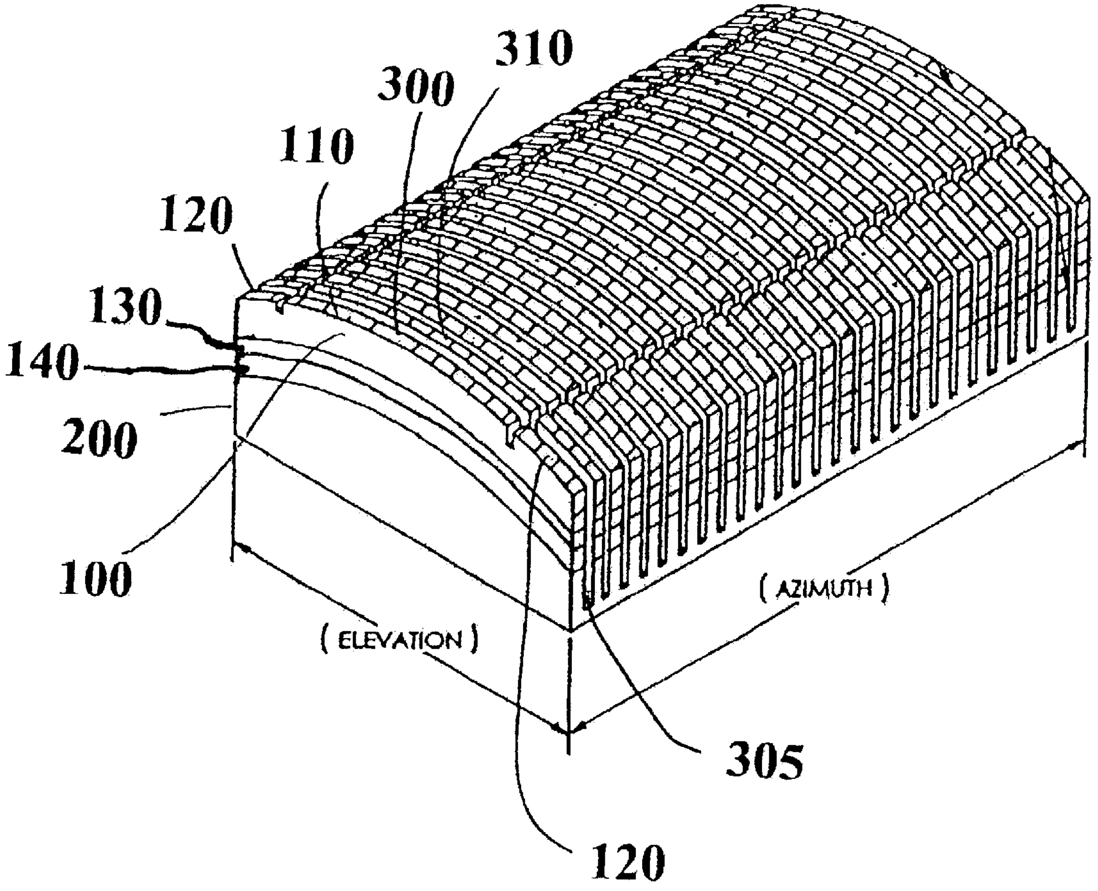
FIG. 5 is an illustration of the assembly of FIG. 4 after a dicing operation of a preferred embodiment.
Figure 6:
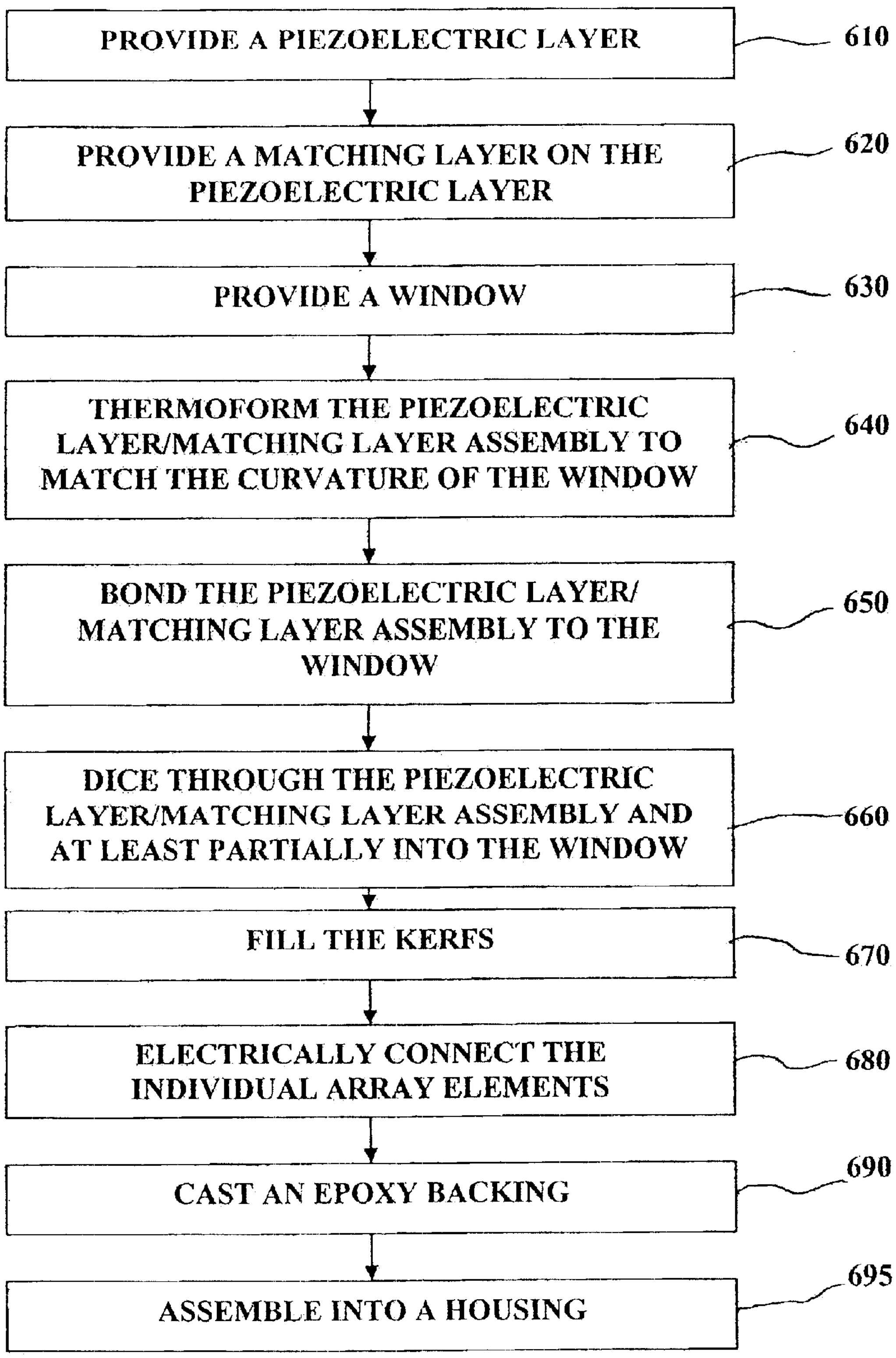
FIG. 6 is a flow chart of a method of manufacturing an ultrasound transducer of a preferred embodiment.

The preferred embodiments relate to an improved ultrasound transducer and a method of manufacture thereof. These preferred embodiments will be described in conjunction with the illustrations of FIGS. 1–5 and the flow chart of FIG. 6. Turning now to the drawings, FIG. 6 is a flow chart of a method for manufacturing an ultrasound transducer of a preferred embodiment. First, a layer of piezoelectric material is provided (act 610). The piezoelectric material can be a monolithic material (such as ceramic) or a composite material (such as a ceramic-epoxy composite). FIG. 1 is an illustration of a layer of piezoelectric material 100 of a preferred embodiment. In this preferred embodiment, the piezoelectric material 100 comprises a 2—2 composite material. Epoxy posts 105 of the composite allow it to be easily bent and shaped to a desired curvature to provide focusing. Disposed on the layer of piezoelectric material 100 is a positive electrode 110 and a "wrap-around" ground electrode 120, which covers the bottom, sides, at a portion of the top surface of the layer of piezoelectric material 100. The active surface of the layer of piezoelectric material 100 is the region under the positive electrode 110 and above the wrap-around electrode 120.

Figure 2:
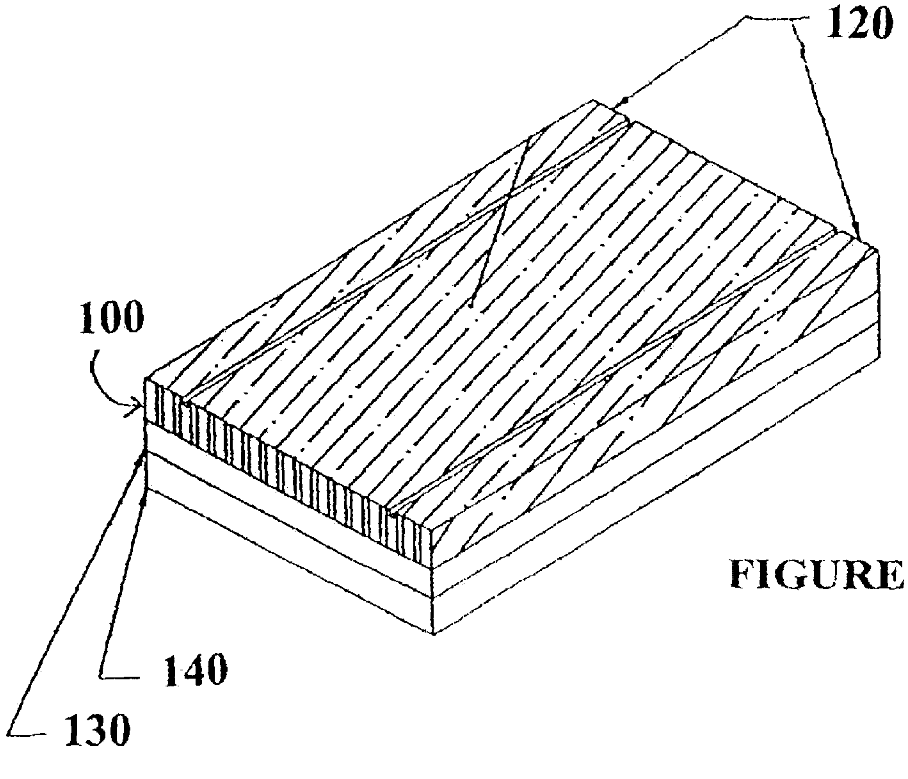
FIG. 2 is an illustration of the layer of piezoelectric material of FIG. 1 coupled with first and second layers of matching material of a preferred embodiment.

Next, one or more layers of acoustic matching material are disposed on the layer of piezoelectric material 100 (act 620). In this preferred embodiment, a first layer of acoustic matching material 130 with a high impedance is cast onto the layer of piezoelectric material 100 and is then ground to a desired thickness. A second layer of acoustic matching material 140 with a low impedance is then cast onto the first layer of acoustic matching material 130 and also ground to a desired thickness. FIG. 2 shows the first and second layers of matching material 130, 140 disposed on the layer of piezoelectric material 100. As the preceding illustrates, the term "cast onto" can mean directly cast onto (such as when the second layer of acoustic matching material 140 is directly cast onto the first layer of acoustic matching material 130) or indirectly cast onto (such as when the first layer of acoustic matching material 130 is indirectly cast onto the layer of piezoelectric material 100 through the wrap-around electrode 120).

It is preferred that the ceramic phase of the 2—2 composite be PZT-5H and that the epoxy phase be Hysol 2039 epoxy. It is also preferred that the layer of piezoelectric material 100 be 19 mm in the azimuth direction, 13 mm in the elevation direction, and 0.50 mm in the range direction. Further, it is preferred that the positive and negative electrodes 110, 120 be made from electroless nickel. Additionally, it is preferred that the first layer of acoustic matching material 130 be Hysol 2039 epoxy with 10 micron $Al_2O_3$ loading and be 0.25 mm in the range direction and that the second layer of acoustic matching material 140 be Hysol 2039 epoxy and be 0.20 mm in the range direction.

Figure 3:
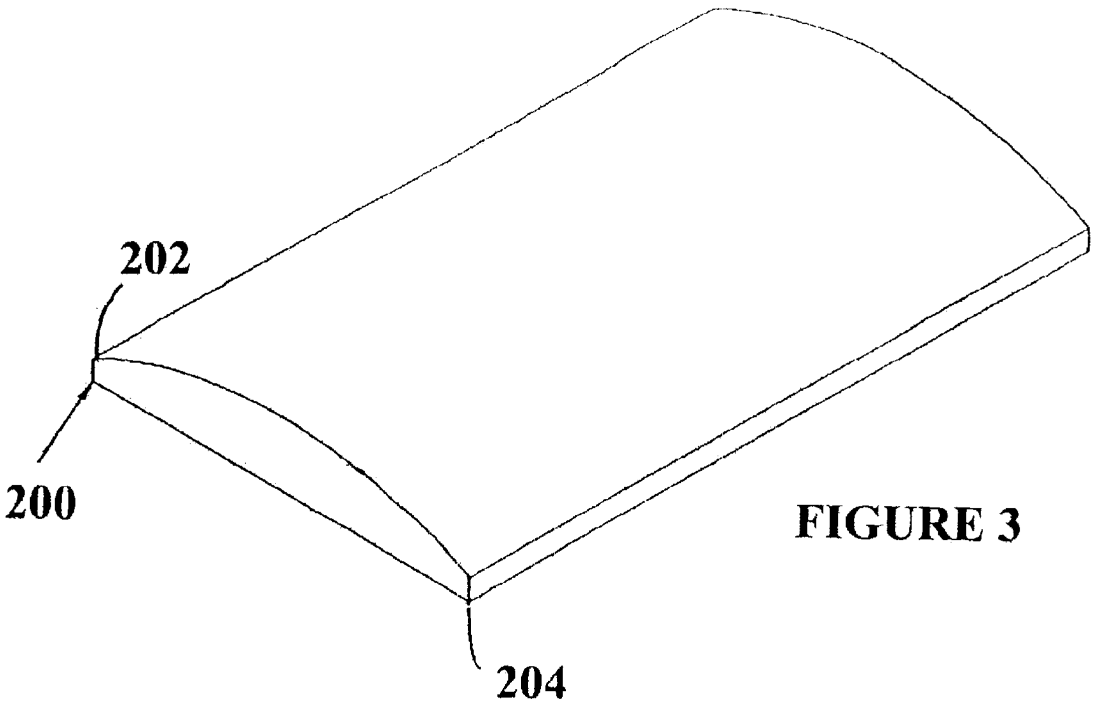
FIG. 3 is an illustration of a window of a preferred embodiment.

Turning again to the flow chart of FIG. 6, a window is provided in act 630. As used herein, the term "window" can refer to a non-focusing, a focusing, or a defocusing acoustic window. FIG. 3 is an illustration of a window 200 of a preferred embodiment. It is preferred that the window 200 be made of a material that is rigid enough to support the piezoelectric material 100 (and the first and second layers of matching material 130, 140) during the dicing operation, while having suitable acoustic transmission properties and being acoustically matched to tissue. Such materials are described in "A Nosepiece Having an Integrated Faceplate Window for Phased-Array Acoustic Transducers," U.S. patent application Ser. No. 09/093,417, filed Jun. 8, 1998, which is assigned to the Assignee of the present invention and which is hereby incorporated by reference. The window 200 preferably comprises a polymer selected from the group consisting of polymethylpentene, low density high grade polyethylene, rubber modified polymethylpentene, and an ionomer compound. In a presently preferred embodiment, the window 200 takes the form of a polymethylpentene thermoplastic. A polymethylpentene such as TPX MX001™ or TPX MX002™, available from Mitsui Petrochemicals (America) Ltd., 250 Park Avenue, Suite 950, New York, N.Y. 10177, is suitable. The mechanical properties of thermoplastic window materials, like TPX, allows the window to provide mechanical support of the individual elements of the transducer during the fabrication process, as described below.

To achieve a desired focusing, the layer of piezoelectric material 100 is curved in the elevation direction. However, if the window 200 is made from a material that focuses or defocuses an acoustic beam, less or more curvature may be preferred to correct for the focusing or defocusing effect of the window 200. In the presently preferred embodiment, the window 200 is made from polymethylpentene and acts as a defocusing window. To correct for the defocusing effect in the present embodiment, it is preferred that the thickness of the window 200 at its ends 202, 204 along the elevation direction be 0.25 mm, and the radius of the curvature of the window 200 be 65 mm.

With the desired radius of curvature determined, the layer of piezoelectric material 100 and layers of matching material 130, 140 are thermoformed to a curvature in the elevation direction that matches the curvature of the window 200 (act 640). In the preferred embodiment, the layer of piezoelectric material 100 and layers of matching material 130, 140 are thermoformed directly over the window 200 itself. In an alternate embodiment, the layer of piezoelectric material 100 and layers of matching material 130, 140 are thermoformed over a convex or concave object having the same curvature as that of the window 200. In another alternate embodiment, instead of thermoforming, the layer of piezoelectric material 100 and layers of matching material 130, 140 are ground to the desired elevation curvature.

Figure 4:
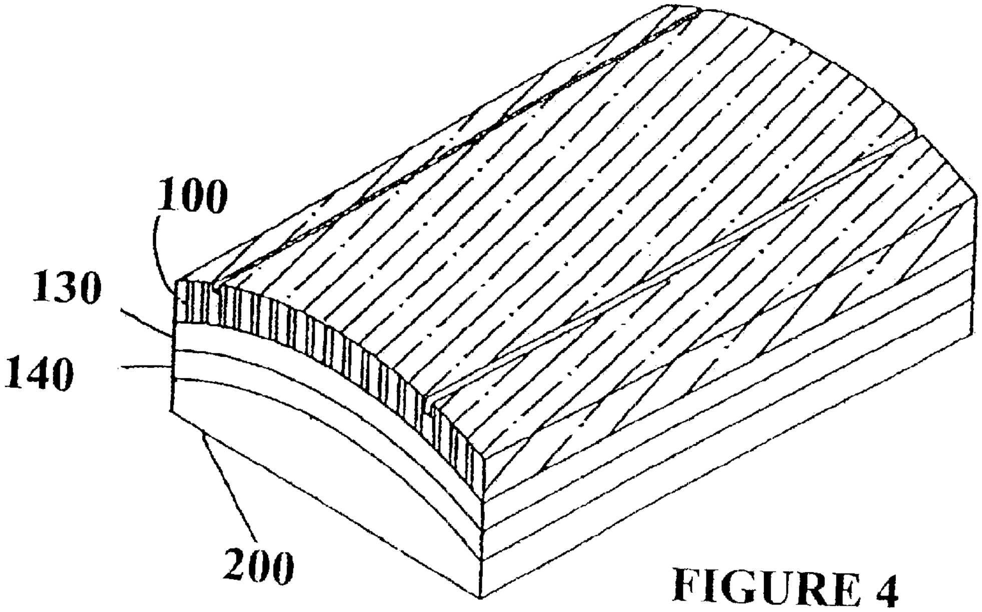
FIG. 4 is an illustration of the assembly of FIG. 2 coupled with the window of FIG. 3.

Next, the layer of piezoelectric material 100 and layers of matching material 130, 140 are bonded to the window 200 (act 650). It is preferred that the window 200 be bonded to the second layer of matching material 140 with an impedance-matched adhesive, such as a polyurethane (preferably, Conap EN-8). As shown in FIG. 4, the layer of piezoelectric material 100 is coupled with and supported by the window 200. As used herein, the term "supported by" means directly supported by or indirectly supported by through one or more components. Similarly, the term "coupled with" means directly coupled with or indirectly coupled with through one or more components. Accordingly, in FIG. 4, the layer of piezoelectric material 100 is coupled with and supported by the window 200 through the first and second layers of matching material 130, 140. In an alternate embodiment in which layers of matching material are not used, the layer of piezoelectric material can be directly supported by and coupled with the window.

As shown in FIG. 4, the window 200 has two surfaces: one surface that faces a region of examination when the transducer is in use (i.e., the patient side) and a second surface that supports the layer of piezoelectric material 100 and holds the transducer elements during and after the dicing operation. With the window 200 supporting the layer of piezoelectric material 100, the layer of piezoelectric material 100 (along with the first and second layers of matching material 130, 140) are then physically separated into at least two elements by dicing through the layer of piezoelectric material 100, through the first and second layers of matching material 130, 140, and at least partially into the window 200 (act 660). It is preferred that a dicing saw, such as a K and S model 980 with a 0.001 inch wide diamond blade, be used. As shown in FIG. 5, a plurality of transducer elements are developed by the dicing operation, such as the first and second transducer elements 300, 310. The dicing operation defines openings in the layer of piezoelectric material 100, the first and second layers of matching material 130, 140, and the window 200. Because the saw dices at least partially into the window 200, a kerf 305 is formed in the window 200 between the first and second transducer elements 300, 310. Although the kerf 305 does not extend all the way through the window 200 in this preferred embodiment, in an alternate embodiment, the saw dices completely through the window 200. The openings defined between the transducer elements 300, 310 are preferably at least partially filled with an acoustically-isolating material (e.g, an elastic kerf filler) (act 670). It is preferred that the acoustically-isolating material be G.E. Silicone Rubber.

After the transducer elements are defined, electrical connections are made to the individual array elements (act 680). It is preferred that wires be soldered onto the positive and negative electrodes 110, 120 and attached to a printed circuit board. With the use of a wrap-around electrode 120, electrical connections to the positive and negative electrodes 110, 120 can be easily made on the same surface of the piezoelectric layer 100. A wiring support block can be used to support the assembly during this operation. Next, an epoxy backing is cast onto the layer of piezoelectric material 100 and allowed to cure (act 690). Finally, the assembly is glued into a housing (act 695). In an alternate embodiment, the window 200 is part of an integrated nosepiece that fits over a transducer housing, as described in the U.S. PATENT application Ser. No. 09/093,417.

With these preferred embodiments, the window acts as the backbone or supporting structure of the piezoelectric material during the dicing operation. Unlike the platen described in the background section, the window remains in place after the dicing operation, thereby avoiding the difficulty and labor associated with removing the support structure. Also, because a solid backer is not used to support the elements in these preferred embodiments, the cast-in-place backer can be more elastic. Further, because both of the matching layers are diced, individual transducer element isolation is improved, thereby improving the off-axis response of the transducer. Additionally, by casting the matching layers onto the piezoelectric layer and by providing the electrical connections to the back of the piezoelectric layer, fewer bond lines and electrical components are present in the acoustic path.

There are several alternatives that can be used with these preferred embodiments. Although two layers of matching material were used in the preferred embodiment described above, fewer or more layers can be used. Additionally, with some piezoelectric materials, it may be preferred not to use any matching layer. Also, while a one-dimensional array was described, the teachings of these preferred embodiments can be used with other types of arrays, such as a two-dimensional N×M array. Further, instead of casting the matching layers onto the piezoelectric layer, the matching layers can be disposed on the piezoelectric layer using a bonding technique. Also, instead of making the electrical connections to the back of the piezoelectric layer, different wiring techniques can be used, such as the technique described in the background section in which a flex circuit and metal foil are placed in the acoustic path. Further, with certain window materials, the window itself may provide the desired focusing without the need to curve the layer of piezoelectric material. In yet another alternative embodiment, transducers of different curvatures, such as the ones described in U.S. patent application Ser. No. 09/093,417, can be used.

The transducers described above can be used with a medical diagnostic ultrasound imaging system in any suitable imaging mode (e.g., B-mode imaging, Doppler imaging, tissue harmonic imaging, contrast agent harmonic imaging, etc.). In one preferred embodiment, the transducer is coupled with a transmit beamformer and a receive beamformer of a medical diagnostic ultrasound imaging system. In operation, a processor causes the transmit beamformer to apply a voltage to the transducer to cause it to vibrate and emit an ultrasonic beam into an object, such as human tissue (i.e., a patient's body). Ultrasonic energy reflected from the body impinges on the transducer, and the resulting voltages created by the transducer are received by the receive beamformer. The processor processes the sensed voltages to create an ultrasound image associated with the reflected signals and displays the image on a display device.

It is intended that the foregoing detailed description be understood as an illustration of selected forms that the invention can take and not as a definition of the invention. It is only the following claims, including all equivalents, that are intended to define the scope of this invention.

What is claimed is:

1. A method of manufacturing an ultrasound transducer, the method comprising:

supporting a layer of piezoelectric material with a window; and separating the layer of piezoelectric material into at least two elements by dicing through the layer of piezoelectric material and at least partially into the window.

2. The method of claim 1, wherein the act of supporting the layer of piezoelectric material with the window comprises the act of coupling the layer of piezoelectric material to the window with an impedance-matched adhesive.

3. The method of claim 2, wherein the impedance-matched adhesive comprises polyurethane.

4. The method of claim 1 further comprising disposing a layer of acoustic matching material between the layer of piezoelectric material and the window prior to dicing.

5. The method of claim 4, wherein the layer of acoustic matching material comprises an epoxy.

6. The method of claim 4, wherein the act of disposing comprises the acts of:

casting the layer of acoustic matching material onto the layer of piezoelectric material; and grinding the layer of acoustic matching material to a desired thickness.

7. The method of claim 4 further comprising disposing at least one additional layer of acoustic matching material between the layer of piezoelectric material and the window prior to dicing.

8. The method of claim 1, wherein the dicing act defines an opening in the layer of piezoelectric material and the window, and wherein the method further comprises at least partially filling the opening with an acoustically-isolating material.

9. The method of claim 8, wherein the acoustically-isolating material comprises rubber.

10. The method of claim 1, wherein the layer of piezoelectric material comprises a 2—2 composite.

11. The method of claim 1, wherein the window comprises a polymer selected from the group consisting of polymethylpentene, low density high grade polyethylene, rubber modified polymethylpentene, and an ionomer compound.

12. The method of claim 1, wherein the window comprises a first surface supporting the layer of piezoelectric material and a second surface that faces a region of examination when the transducer is in use.

13. The invention of claim 1, wherein the window comprises a non-focusing window.

14. The invention of claim 1, wherein the window comprises a focusing window.

15. The invention of claim 1, wherein the window comprises a de-focusing window.

16. The invention of claim 1, wherein the window comprises a curvature, and wherein the method further comprises the act of providing the layer of piezoelectric material with a curvature that matches the curvature of the window.

17. An ultrasound transducer comprising:

a first transducer element;

a second transducer element; and a window coupled with the first and second transducer elements and comprising a kerf in the window positioned between the first and second transducer elements.

18. The invention of claim 17, wherein the window comprises a first surface coupled with the first and second transducer elements and a second surface that faces a region of examination when the transducer is in use.

19. The invention of claim 17 further comprising a third transducer element coupled with the window, and wherein the window comprises an additional kerf positioned between the third transducer element and one of the first-mentioned transducer elements.

20. The invention of claim 17, further comprising an impedance-matched adhesive between the first and second transducer elements and the window.

21. The invention of claim 20, wherein the impedance-matched adhesive comprises polyurethane.

22. The invention of claim 17, further comprising a layer of acoustic matching material between at least one of the first and second transducer elements and the window.

23. The invention of claim 22, wherein the acoustic matching material comprises an epoxy.

24. The invention of claim 22, further comprising at least one additional layer of acoustic matching material between the at least one of the first and second transducer elements and the window.

25. The invention of claim 17, wherein an opening is defined between the first and second transducer elements, and wherein an acoustically-isolating material is disposed in the opening.

26. The invention of claim 25, wherein the acoustically-isolating material comprises rubber.

27. The invention of claim 17, wherein the first and second transducer elements comprise a 2—2 composite.

28. The invention of claim 17, wherein the window comprises a polymer selected from the group consisting of polymethylpentene, low density high grade polyethylene, rubber modified polymethylpentene, and an ionomer compound.

29. The invention of claim 17, wherein the window comprises a non-focusing window.

30. The invention of claim 17, wherein the window comprises a focusing window.

31. The invention of claim 17, wherein the window comprises a de-focusing window.

32. In a method of manufacturing an ultrasound transducer comprising a separating act in which a layer of piezoelectric material is separated into at least two elements, the improvement comprising coupling a window to the layer of piezoelectric material prior to the separating act, wherein the separating act comprises the act of dicing through the layer of piezoelectric material, and wherein the dicing act comprises the act of dicing at least partially into the window.

33. The invention of claim 32, wherein the window comprises a polymer selected from the group consisting of polymethylpentene, low density high grade polyethylene, rubber modified polymethylpentene, and an ionomer compound.

* * * * *